(12) United States Patent
Frerking

(10) Patent No.: US 6,977,557 B1
(45) Date of Patent: *Dec. 20, 2005

(54) INJECTION MODE STEERING OSCILLATOR

(76) Inventor: Marvin Elmer Frerking, 279 Crandall Dr. NE., Cedar Rapids, IA (US) 52402

(*) Notice: Subject to any disclaimer, the term of this patent is extended or adjusted under 35 U.S.C. 154(b) by 65 days.

This patent is subject to a terminal disclaimer.

(21) Appl. No.: 10/807,788

(22) Filed: Mar. 25, 2004

(51) Int. Cl.[7] ............................. H03B 5/32; H03B 5/36
(52) U.S. Cl. .................. 331/173; 331/55; 331/158; 331/172
(58) Field of Search ................ 331/46, 50, 55, 331/78, 116 R, 116 FE, 158–159, 172–173, 331/175–176

(56) References Cited

U.S. PATENT DOCUMENTS

| | | | |
|---|---|---|---|
| 3,007,045 A * | 10/1961 | Paynter | ...................... 455/321 |
| 5,394,117 A | 2/1995 | Cohen | |
| 5,546,056 A | 8/1996 | Tokumitsu | |
| 5,650,749 A | 7/1997 | Main | |
| 6,175,285 B1 | 1/2001 | Gabara | |
| 6,317,008 B1 | 11/2001 | Gabara | |
| 6,369,659 B1 | 4/2002 | Delzer | |
| 6,545,550 B1 | 4/2003 | Frerking | |
| 6,580,330 B1 | 6/2003 | Katznelson | |
| 6,667,660 B2 | 12/2003 | Schrodinger | |

OTHER PUBLICATIONS

Cunningham, W.J., *Introduction To Nonlinear Analysis*, McGraw-Hill Book Company, New York, 1958, pp 213-220.
Kurokawa, K., "Injection Locking of Microwave Solid-State Oscillator,", Proc. of the IEEE, v61, Oct. 10, 1973, pp 1385-1410.
Berenguer, J. et al., "Improvement of the Pull-In Range and Acquisition Time of a Microwave P.P.L. System By Injection Locking the V.C.O.,", Proc. of the 41st Annual Frequency Control Symposium, Philadelphia, pp 524-526.

* cited by examiner

*Primary Examiner*—David Mis

(57) ABSTRACT

A means is provided to establish oscillations on a particular mode or resonance of a quartz crystal in a crystal oscillator and to discriminate against other modes. This is done by injecting a signal close in frequency to the desired mode until oscillation have been established and saturation of the active element has occurred. The limiting process then discriminates against the unwanted modes and holds the oscillation on the desired mode.

18 Claims, 3 Drawing Sheets

INJECTION MODE STEERING OSCILLATOR

CROSS REFERENCE TO RELATED APPLICATION

Not Applicable

BACKGROUND

1. Field of Invention

The invention is related to electrical oscillations and in particular to crystal oscillators where there are multiple modes of resonance in the crystal and it is desired to establish oscillations on a particular mode of the crystal.

2. Description of Prior Art

A quartz crystal oscillator consists of a crystal resonator and a sustaining circuit. The quarts crystal itself has various modes of resonance such as the fundamental thickness sheer mode, overtone thickness sheer modes, extensional modes, flexural modes, etc. In many cases one of the modes is significantly more active than the others and oscillations commence on the frequency of that mode. It is often possible to design the sustaining circuit to favor a particular mode of oscillation, e.g. the third overtone rather than the fundamental mode and produce oscillations on that frequency. In the case of a stress compensated (SC) quartz crystal, selection of a C-mode or B-mode is also possible. The B and C modes are close in frequency, within 10%, and fairly sharp frequency selection circuits are necessary in the sustaining circuit to select a particular mode. The use of sharp frequency selective elements in the sustaining circuit generally results in a degradation of the frequency stability of the quartz resonator because of variations in the selective elements such as inductors that change in value with temperature, with time or exhibit retrace characteristics.

If the strengths of the modes in the crystal are not too different, once oscillation has been established on a particular mode and saturation has occurred on that mode, the highly frequency selective elements can be switched out of the oscillator to enhance the stability. This is discussed in U.S. Pat. No. 654,550 in the case of sequenced multi-mode oscillators. The mode control networks may require precise tuning such as with a varactor and it may in some cases be necessary to adjust the tuning voltage for the particular ambient temperature. This is an obvious complication. The electronic switches used to remove the mode control network may also be imperfect resulting in some residual frequency pulling effects.

The present invention provides an alternate means of steering the oscillator to the correct mode by injecting a signal with energy close to the desired mode into the resonator during the build up of oscillations. Normally when an oscillator is turned on, all mode for which the loop gain is greater that unity and the phase shift is 360 degrees, begin to build up simultaneously from the residual noise level of the sustaining circuit. The mode reaching the saturation amplitude first then causes a relative reduction in gain at frequencies different from the saturating mode. This causes the other modes to die out. Injection of a signal significantly higher than the noise level of the sustaining circuit, if it is close to a specific mode, may often be sufficient to insure that the favored mode will survive. The procedure may also significantly decrease the time required for oscillations to build up on the selected mode. After saturation has occurred, the desired mode may remain locked to the injection signal if it is a sine wave until it is remove if it is close enough to the natural resonance of the oscillator. If such locking does occur it is only momentary since the injection signal is removed after saturation has occurred. Injection locking of a oscillator under steady state conditions is well known in the art and is a method of precisely controlling the frequency of an oscillator. A harmonic or sub-harmonic is often used for locking in this case. The injection signal must, of course, be present continuously for such frequency control to occur, and the two frequencies must be precisely the same of precisely related harmonically.

In the present invention the injection mode control signal is present only during the build up of oscillation, and it is in general not necessary for the injection signal to be close enough in frequency to the natural resonance of the oscillator so that locking would occur if it remained present after saturation. It is only necessary that the injected signal create enough energy in the vacinity of the desired mode so that the desired mode builds up faster that the other modes that are to be discriminated against. The injected signal may be a sine wave or it may be band limited noise. The use of band limited noise may be advantageous since it avoids the necessity to position the center frequency of the injection as precisely as a sine wave to be effective.

The mode steering injection signal can easily be generated by the use of a direct digital frequency synthesizer (DDS) in connection with a second crystal oscillator that provides the clock for the DDS. The power spectrum of a DDS can also easily be broadened by applying phase or frequency modulation. Even in the case of a sine wave, the injection mode control signal need not be precisely positioned and the second oscillator can be of lesser quality than that of the injection steered oscillator. In one application of the invention a second crystal oscillator is already present in the application and that oscillator is used as the clocking signal for the DDS. It is not necessary for the DDS to provide a spectrally pure signal as before mentioned since the only requirement is to provide increased noise in the vicinity of the desired mode of resonance. This may result in a simplified DDS so that it consist essentially of an adder and a phase accumulator. If the DDS is modulated with bandlimited noise, the allowable separation between the mode steering frequency and the desired mode may be advantageously increased.

It is worth noting that the use of an injection signal to enhance the power spectral density in the vacinity of a particular mode to reduce the build up time for that mode during start up is fundamentally different from the case where a locking signal is injected into an oscillating circuit resulting in a phase shift of the feedback signal to cause frequency locking. Such a signal must be very close to the natural frequency of the oscillator and it must remain present during operation of the oscillator. It must also be large enough to maintain an influence on the phase after the amplitude has become large in steady state. The requirement on the mode steering signal is only that it must be significantly larger than the residual noise level of the sustaining circuit in the vicinity of the desired mode.

SUMMARY

The present invention consists of a crystal oscillator with multiple modes of resonance in the resonator. An external signal or band limited noise near one of the modes is injected into the oscillator at start up which increases the power spectral density of the excitation for the desired mode. This causes it to build up more rapidly than the modes to be discriminated against. After steady state has occurred, saturation effects cause a differential reduction in gain at frequencies different from the desired mode. This causes the other modes to be suppressed. The mode steering injection signal is then removed and oscillation continues on the desired mode. Frequency locking may or may not occur during the mode steering phase.

DRAWINGS AND FIGURES

In order that the invention may be readily carried into practice a number of embodiments will be described in detail using the accompanying drawings in which.

DESCRIPTION OF INVENTION

Figure 1:
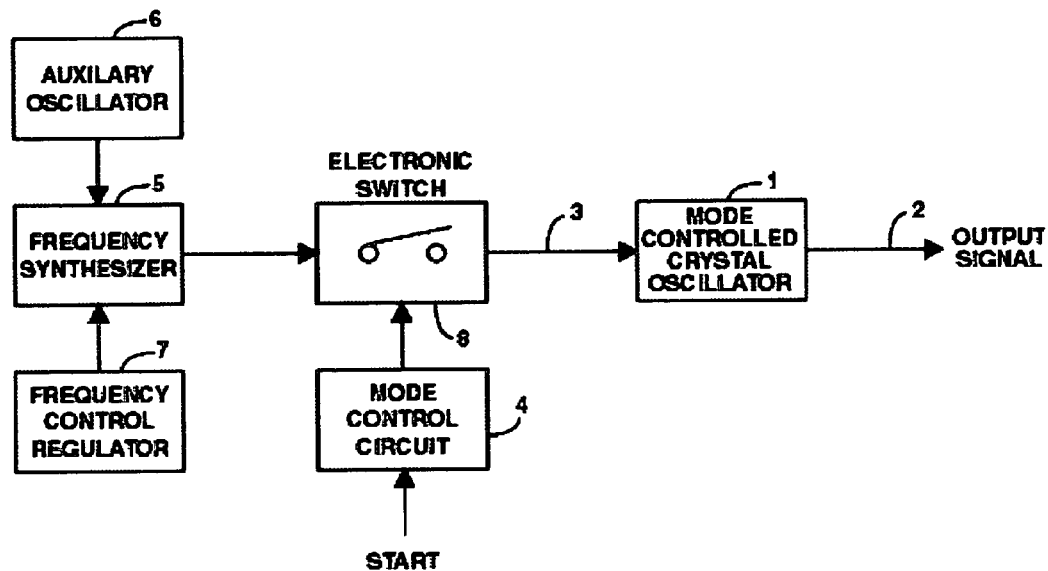
FIG. 1 is a block diagram level description illustrating the basic functional parts of the invention.
Figure 2:
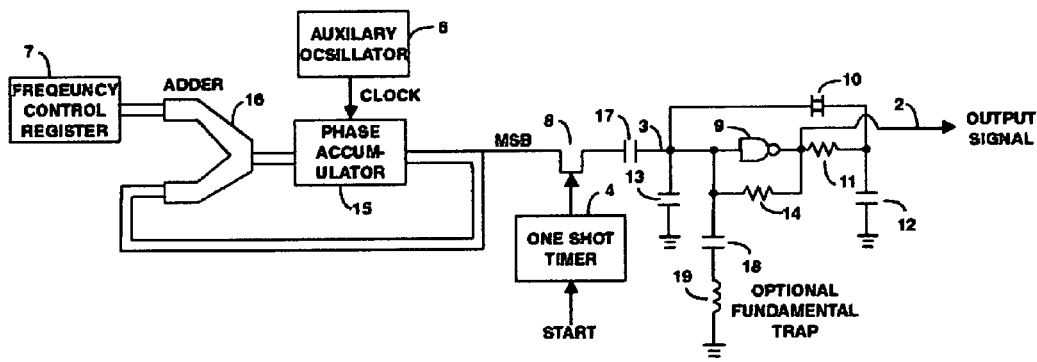
FIG. 2 is a detailed description showing the invention implemented in a simple form.
Figure 3:
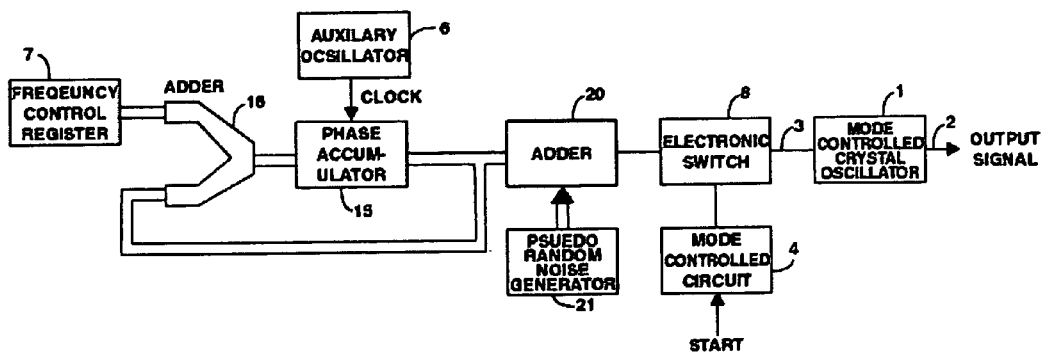
FIG. 3 is a block diagram showing the invention implemented with a noise injection signal.
Figure 4:
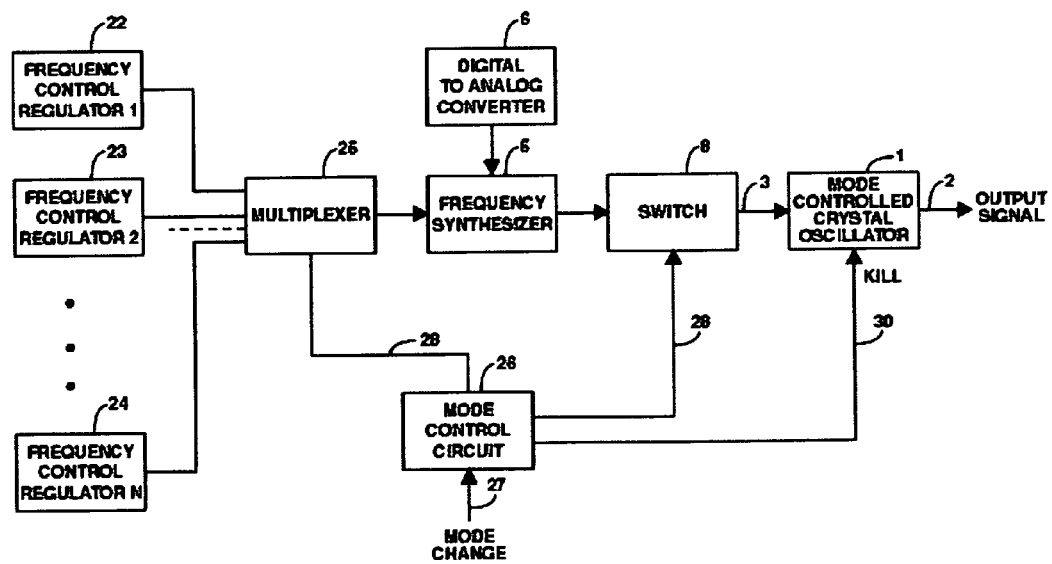
FIG. 4 is a block diagram illustrating how the invention is used to sequentially execute various modes of resonance in a crystal oscillator.
Figure 5:
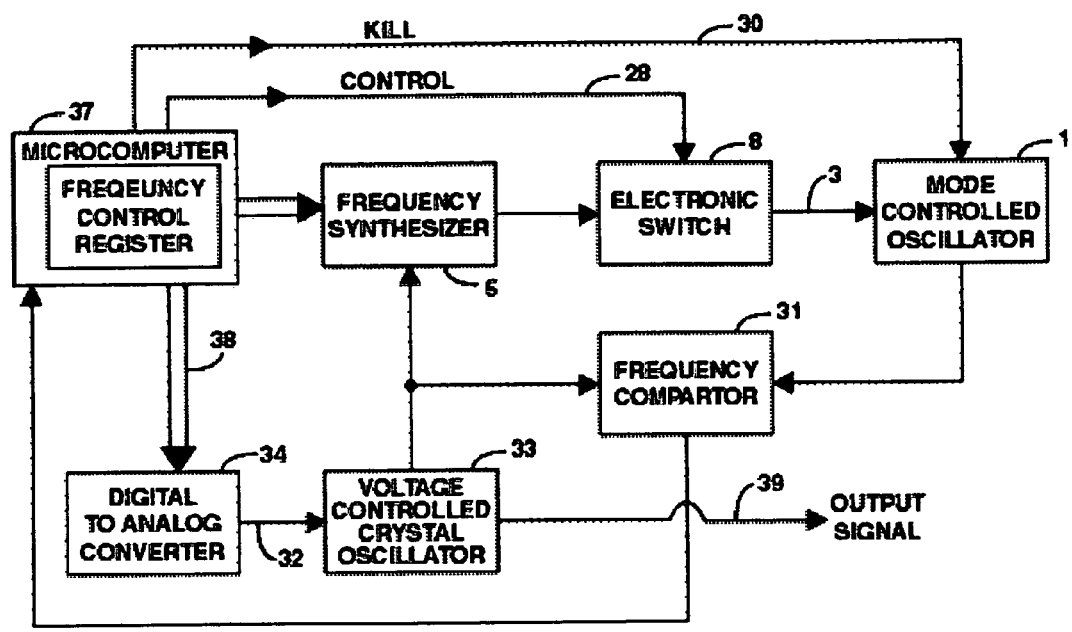
FIG. 5 is a block diagram showing the preferred embodiment of the invention taking advantage of sequential mode operation in a temperature compensated crystal oscillator.

An injection mode steered crystal oscillator is shown in FIG. 1. A more detailed diagram of the implementation in which a direct digital frequency synthesizer (DDS) is used is shown in FIG. 2. FIG. 3 shows the invention implemented with band limited noise injection. FIG. 4 shows how the invention can be implemented to select various mode of oscillation in any desired sequence. FIG. 5 shows the preferred embodiment when applied to a temperature compensated crystal oscillator.

FIG. 1, to which reference should now be made, shows the basic invention. When the crystal oscillator 1 is turned on an injection signal 3, which is near the desired natural resonance frequency of the desired mode, is injected into to oscillator causing oscillations on the desired mode to build up faster than those of the modes to be discriminated against. After the desired mode has built up to the point where saturation effects occur, the other modes die out. This occurs because saturation causes the active device to produce a constant amplitude signal switching basically at the frequency of the saturating signal. This switching action reduced the relative gain at any other frequency by as much as an additional 6 db. After saturation has occurred, switch 8 is opened removing the mode steering signal from the oscillator. Oscillation then continues on the desired mode, provide that the other modes are not greatly more active than the desired mode. The electronic switch 8 is controlled by the mode control circuit 4. The mode control circuit is basically a timer that keeps switch 8 closed for a predetermined length of time.

The mode steering signal is generated by frequency synthesizer 5 at a predetermined frequency stored in control register 7. The reference signal for the frequency synthesizer 5 is supplied by the auxiliary oscillator 6. In case of a fundamental mode high Q quartz crystal resonator the precision of the injection is in the order of a few tenths of a percents to around a percent. This can be easily achieved with a low cost crystal oscillator. The spectral purity of the frequency synthesizer 5 is if no particular consequence since it is switched out of the circuit after saturation has occurred. It may in some cases be desirable to incorporate random phase noise on the steering injection signal as before mentioned to reduce the precision required to position it.

The output signal 2 from the crystal oscillator is normally not used until the mode steering signal 3 has been remove and the oscillator output has stabilized. If the mode controlled crystal oscillator 1 is enclosed in an oven to enhance the stability it may be desirable to delay turn on of the oscillator until it has reached the operating temperature. This increases the allowable tolerance on the frequency of the mode steering signal and also avoids the possibility that an activity dip in the desired mode, at some specific temperature during warm-up, might cause the oscillation to jump to a different mode.

The mode steering procedure eliminates the need to incorporate a highly frequency selective network in the oscillator to insure that oscillation will occur on the desired mode. A particularly important case is in a crystal oscillator using a stress compensated (SC-cut) crystal. An SC cut crystal has a spurious resonance (B-mode) 9.5% above the desired C-mode, and in some designs oscillation occurs on the undesired mode unless a frequency selective trap is incorporated in the circuit. The trap which includes an inductor may degrade the stability and aging characteristics of the crystal resonator as well as add a certain amount of frequency hystersis as a result of temperature changes. The present invention avoids this degradation by injection mode steering.

FIG. 2, to which reference should now be made, shows a more detailed implementation of the invention. The mode steering oscillator consists of logic gate 9, crystal 10, series resistor 11, and feedback capacitors 12 and 13. A resistor 14, which has a high value of resistance, biases the inverting CMOS gate 9 into its active region. The gate then provides AC gain with a 180 degree phase shift. The pi network consisting of capacitor 12, crystal 10, and capacitor 13 provides an additional 180 degrees of phase shift and also presents a resistive load to resistor 11. Thus a total of 360 degrees of phase shift is present causing regenerative oscillations. The resistor 11 effectively increase the output impedance of the gate 9 making the circuit more sensitive to the crystal impedance changes and consequently less sensitive to factors affecting gate 9 such as supply voltage variations. The injection signal 3 is applied to the crystal through electronic switch 8 and DC blocking capacitor 17. At turn on, oscillation builds up on all modes of the crystal 10 for which the loop gain is greater than unity and for which the phase shift is 360 degrees. This continues until the output voltage of the gate saturates. Since the injection mode steering signal enhances the build up of oscillation for a particular mode, that mode reaches the saturation amplitude first. The limiting process in the gate 9 then reduces the AC gain until it is unity at the frequency of the desired mode. The gain reduction is greater at all other frequencies and approaches an additional 6 db caused by the limiting action. Consequently once limiting oscillations are taking place, the mode of oscillation is difficult to change. The mode steering injection signal is then removed by opening electronic switch 8 as determined by timing circuit 4. The period of the timing circuit 4 is chosen to allow sufficient time for the desired mode to cause limiting oscillations prior to disconnecting the mode steering injection signal. Under normal conditions this is only a fraction of a second.

The limiting process may not be sufficient to discriminate against resonance modes that are vastly separated in frequency. A case of significant importance is that of an oscillator that is required to operate on the third overtone mode of a crystal where an active fundamental resonance is also present in the crystal. For many oscillator types such as the Colpitts and Pierce varieties the small signal loop gain is 19 db higher at the fundamental frequency that at the third overtone frequency and the limiting process is not sufficiently strong to overcome this difference in gain. Therefore it may be necessary to incorporate a fundamental mode trap consisting of inductor 19 and DC blocking capacitor 18. The value of inductor 19 is chosen so that it is resonant with capacitor 13 above the fundamental mode frequency but below the third overtone mode frequency. This makes it impossible to achieve 360 degrees of phase shift at the fundamental frequency so that oscillations cannot occur on the fundamental frequency. It should be noted that the resonance of this circuit can be chosen to be far removed from the third overtone frequency so that the inductor has only a minimal effect on the third overtone mode. A much more troublesome situation occurs, however, when a B mode trap is necessary to allow operation on the C mode and vice versa. Since these modes are less than 10% separated in frequency the mode selection network must operate with resonances nearer the desired mode which results in a more severe degradation of the frequency stability.

The mode steering injection signal is produced by a direct digital frequency synthesizer (DDS) consisting of frequency control register 7, digital adder 16, and phase accumulator 15 which is basically a latch storage register. The value by which the phase is incremented each clock cycle is prestored in frequency control register 7 which determines the frequency. The most significant bit of the phase accumulator 15 serves as the output and is used for the injection signal. The clocking signal for the phase accumulator 15 is produced by an auxiliary oscillator 6, which as noted previously may be of lessor stability.

In a high quality DDS the output of the phase accumulator 15 is applied to a sine wave generator followed by a digital to analog converter to produce a sine wave output. As noted previously, however these are not required by the present invention.

An embodiment of the invention in which band limited noise is used as the steering injection signal is shown in FIG. 3. The use of band limited noise greatly reduces the precision with which the center frequency of the injection signal must be positioned. In this case the band limited noise is produced by random phase modulation applied to the output of a direct digital frequency synthesizer (DDS). The DDS as discussed in connection with FIG. 2 consists of frequency control register 7, adder 16, phase accumulator 15, and auxiliary oscillator 6. In this implementation, however, rather than using the most significant bit (MSB) of the phase accumulator for the injection, a pseudorandom number generator 21, is used to produce noise like values that are added to the phase accumulator output by adder 20. The noise values may be calculated at a slower rate than the update rate of the DDS and correspond approximately to the amount that the frequency spectrum of the steering signal is to be spread. The output of adder 20 could be applied to a sine wave generator and a digital to analog converter (DAC) to generate the injection signal if desired, however, as before started, because the spectrum of the injection signal need not be pure, a single bit corresponding to the MSB of DDS may be used resulting in a simplification of the hardware. The injection signal from adder 20 is applied to the mode controlled oscillator 1 through electronic switch 8. The switch is closed initially at start up. After the mode controlled oscillator 1 has reached the saturation amplitude, and the mode control circuit 4 has timed out, the electronic switch 8 is opened removing the injection signal from the oscillator.

An embodiment of the invention in which multiple modes of oscillation can be initiated sequentially is shown in FIG. 4. Multiple frequency control registers 22–24 are shown, one for each frequency that is to be stimulated. Each register is prestored with the frequency of one of the modes that is to be stimulated. The particular frequency control register to be used at a given time is selected by a multiplexer 25. The multiplexer 25 is controlled by the mode control circuit 26 through control lines 28. When a new frequency is required the mode control circuits 26 is directed to initiate the new frequency by mode change input 27. Upon receiving this command the mode control circuit 26 initiates three actions. The first is to squelch the existing oscillations in the crystal oscillator 1 by way of kill line 30. It then selects the desired frequency control register 22–24 by way of multiplexer 25 so that the desired control word is applied to the frequency synthesizer 5. Thirdly it connects the injection signal from the frequency synthesizer 5 to the mode controlled crystal oscillator 1 by closing switch 8 using control line 28. Oscillation then builds up on the desired mode of oscillation. After a predesignated time sufficient to allow saturation to occur, the mode control circuit 26 opens switch 8 by means of control line 28, and the mode change is complete.

It should be noted that if a large injection signal 3 is used, it may not be necessary to include a kill line 30 and the frequency may switch due to the strong injection signal causing the oscillator to saturate.

FIG. 5 shows the preferred embodiment of the invention in a precision temperature compensated crystal oscillator. This is essentially the same application described in U.S. Pat. No. 6,545,550 except that the mode steering is accomplished by injecting a signal into the oscillator rather than by using a tuned network that is switched out of the circuit after saturation has occurred.

In this implementation the function of the auxiliary oscillator is performed by a voltage controlled crystal oscillator (VCXO) 33. The modes of oscillation in crystal oscillator 1 are selected by injecting a mode control signal from frequency synthesizer 5 as before. The frequency control words are stored in the memory of microcomputer 37 rather than in separate frequency control registers as was discussed in connection with FIG. 4. The microcomputer 37 causes the crystal oscillator 1 to sequence through a series of modes of oscillation using control line 30 to squelch each oscillation before a new mode is initiated. Control line 28 is used in connection with switch 8 to remove the injection signal after oscillations have been established. The frequency of the VCXO 33 is compared with the frequency of the mode controlled crystal oscillator 1 during each mode of the latter. The frequencies of two of the modes compared to the VCXO frequency can be combined to obtain a measure of the ambient temperature since the temperature coefficients of the modes in the crystal oscillator 1 are all different. Information on the temperature characteristics of one of the modes can be prestored in the microcomputer memory and this, combined with the measure of the temperature, used to determine the actual frequency to the VCXO 33 at that temperature. A correction value for VCXO is then calculated by the microcomputer 37 and applied to the digital to analog converter 34 by way of control lines 38. The VCXO 33 then being kept on the desired frequency, is used as the output signal 39 from the temperature compensated crystal oscillator.

It should be noted that by utilizing a plurality of modes in crystal oscillator 1 it is possible to compensate for more than temperature, i.e. hysteresis effects, aging, etc. This is described in U.S. Pat. No. 6,545,550.

What is claimed is:

1. A crystal controlled oscillator which includes means for steering the frequency of oscillation to a particular mode of the crystal during the build up of oscillation by injecting a signal into the oscillator augmenting the noise energy available for oscillations to build up on the desired mode.

2. A crystal oscillator of claim 1 in which a frequency synthesizer which includes an independent frequency reference is used to produce a steering injection signal close in frequency to the desired mode.

3. The crystal oscillator of claim 2 in which the frequency synthesizer is fine tuned to reduce the build up time of oscillations by precisely positioning the injection signal at the anticipated resonance of the desired mode.

4. The crystal oscillator of claim 2 in which the independent frequency reference is a VCXO which was fine tuned by the mode steering crystal oscillator in the recent past.

5. The crystal oscillator of claim 2 in which the VCXO is temperature compensated using two or more modes of oscillation in the mode steering oscillator.

6. The crystal oscillator of claim 2 in which the frequency spectrum of the frequency synthesizer is broadened by modulating phase noise onto the output or sweeping the frequency.

7. The crystal oscillator of claim 1 in which an auxiliary oscillator is used to produce the mode steering injection signal.

8. The crystal oscillator of claim 1 in which the mode steering signal is removed after oscillations have saturated the oscillator on the desired mode of oscillation.

9. The crystal controlled oscillator of claim 1 in which initiation of oscillation and mode steering are delayed until the oscillator has reached the operating temperature if a crystal oven is used.

10. A crystal oscillator comprising a gain element that is frequency selective due to saturation at one frequency; a crystal resonator capable of being excited on different modes; a frequency synthesizer with an independent frequency reference generating an injection signal capable of encouraging oscillation on a desired mode.

11. The crystal oscillator of claim 10 in which the frequency synthesizer is broadened by modulating noise onto the output or by sweeping the frequency.

12. The crystal oscillator of claim 10 is which the injection signal is removed after oscillations have stabilized on the desired mode of oscillations.

13. The crystal oscillator of claim 10 in which the frequency reference for the frequency synthesizer is a VCXO, being fine tuned by the mode steering crystal oscillator in the recent past.

14. The crystal oscillator of claim 10 is which the VCXO is temperature compensated by using two or more modes of oscillation in the mode steered crystal oscillator.

15. The crystal oscillator of claim 10 in which the frequency synthesizer is fine tuned to the anticipated frequency of the desired mode to reduce the build up time of the desired mode.

16. The crystal oscillator of claim 10 is which initiation of oscillation is delayed until the oscillator has reached the operating temperature if a crystal oven is used.

17. A crystal oscillator compromising a gain element that is frequency selective due to saturation at one frequency; a crystal resonator capable of being excited on different modes; an auxiliary oscillator generating a frequency near the desired mode in the crystal resonator; and a switching means to connect the injection signal to the mode controlled crystal oscillator until saturation has occurred and then removing it.

18. A crystal oscillator of claim 17 in which the frequency spectrum of the auxiliary oscillator is broadbaned by modulation using band limited noise or pseduonoise.

* * * * *